United States Patent [19]
Hirakawa

[11] Patent Number: 5,994,773
[45] Date of Patent: *Nov. 30, 1999

[54] BALL GRID ARRAY SEMICONDUCTOR PACKAGE

[76] Inventor: Tadashi Hirakawa, 9-31-705, Hiroshiba-Cho, Suita, Osaka 564, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/811,810

[22] Filed: Mar. 6, 1997

[30] Foreign Application Priority Data

Mar. 6, 1996 [JP] Japan ................................. 8-078261

[51] Int. Cl.$^6$ .................................................. H01L 23/14
[52] U.S. Cl. ......................... 257/702; 257/668; 257/692
[58] Field of Search ................................. 257/738, 787, 257/779, 697, 692, 693, 668, 702, 780

[56] References Cited

U.S. PATENT DOCUMENTS

| | | | |
|---|---|---|---|
| 3,838,984 | 10/1974 | Crane et al. ........................... | 29/193.5 |
| 5,045,921 | 9/1991 | Lin et al. ............................... | 257/780 |
| 5,409,865 | 4/1995 | Karnezos ............................... | 257/738 |
| 5,420,460 | 5/1995 | Massingill ............................. | 257/693 |
| 5,600,180 | 2/1997 | Kusaka et al. ......................... | 257/780 |
| 5,604,379 | 2/1997 | Mori ...................................... | 257/738 |
| 5,608,265 | 3/1997 | Kitano et al. .......................... | 257/738 |
| 5,616,958 | 4/1997 | Laine et al. ............................ | 257/738 |
| 5,640,047 | 6/1997 | Nakashima ............................ | 257/780 |
| 5,650,593 | 7/1997 | McMillan et al. ..................... | 257/779 |
| 5,656,863 | 8/1997 | Yasunaga et al. ..................... | 257/780 |
| 5,663,593 | 9/1997 | Mostafazadeh et al. ............... | 257/738 |
| 5,663,594 | 9/1997 | Kimura ................................. | 257/738 |
| 5,672,912 | 9/1997 | Aoki et al. ............................. | 257/738 |
| 5,859,475 | 1/1999 | Freyman et al. ...................... | 257/738 |

OTHER PUBLICATIONS

John H. Lau; "Ball Grid Array Technology"; 1995; Frontispiece/pp. 29–30.

*Primary Examiner*—Nathan K. Kelley
*Attorney, Agent, or Firm*—Skjerven, Morrill, MacPherson, Franklin & Friel LLP

[57] ABSTRACT

A ball grid array semiconductor package includes an insulative base material; circuitry metallizations formed on a first surface of the material, each metallization having a grid pad electrode; and a semiconductor chip mounted on the first surface and electrically connected to the circuitry metallizations. The base material is opened from a second surface of the base material at a location under each grid pad electrode; and each opening confines a portion of a solder ball which is in melt-fixed connection to a back side of each grid electrode.

11 Claims, 4 Drawing Sheets

BALL GRID ARRAY SEMICONDUCTOR PACKAGE

FIELD OF THE INVENTION

This invention is related to the structure and manufacturing method of ball grid array semiconductor packages. More specifically, this invention is related to the structure of low cost, highly reliable, and robust package and the method of manufacturing such a package.

BACKGROUND OF THE INVENTION

Grid array packaging has become an outstanding technique of connecting semiconductor chips with a printed circuit board. This technology, known as a ball grid array (BGA) or chip size package (CSP), is designed to make connection with a printed circuit board (PCB) often called a "mother board" containing grid pads, and by placing solder balls or solder paste on these pads. This technology is described in the book "Ball Grid Array Technology" edited by John H. Lau and published by McGraw Hill in 1995. In the ball grid array package 20 schematically shown in FIG. 9 (and essentially in FIG. 1.37 of such book), circuits 4, 4 (metallizations) are formed on both sides of a substrate or base material A such as an insulative PCB. A semiconductor chip 6 is mounted on the first surface 1 of the substrate, and pad electrodes 5 are formed in a grid on a second surface 2 of the substrate. The electrical connections between the circuits 4 on first surface 1 and the semiconductor chip 6 mounted on that first surface are made by wire bonds 11, and the electrical connections between the circuits 4 (metallizations) on the first surface 1 and the circuits 4 (metallizations) on the opposite second surface 2 of the substrate are usually made by a copper plating 13 of through-holes 12 located on the edges of a ball grid array 15. The semiconductor chip 6 is encapsulated molded by a molding resin 7.

The conventional BGA structure shown in FIG. 9 has the following problems. Firstly, since all electrical pads and area grid array pads, are routed out to the external edges, routing becomes extremely difficult when the semiconductor chip has a high density and a high pin count. Secondly, to insulate the circuits routing to the external edges and prevent flow of solder in the reflow soldering process, a solder resist process has had to be used to isolate the grid pads This process is relatively expensive. Thirdly, since the pad electrodes are planar, the solder ball or solder paste had small shear strength, and the solder balls were liable to delaminate. Fourthly, since the grid array package used a substrate from solid laminates such as a glass-epoxy laminate, reel-to-reel operation was impossible, and the mounting cost was expensive. To solve the first problem, a method of forming via-holes from the first surface to the second surface, and plating the internal surface of the via-holes (e.g. Japanese Open Patent, 7-74281) was developed. In this technology, the first problem is solved because the pad electrode is directly connected electrically to the circuit on the first surface.

The conventional ball grid array packages and their manufacturing methods required traces routing to the external edges from each pad electrode making grid rows on the substrate. The conventional package had difficulty in routing to the external edges and, to insulate routing traces and to prevent flowing of solder balls during reflow soldering, solder resist was required, which made it very expensive. The solder ball had a flat structure, and had a small solder ball shear strength, and easily delaminated.

Another conventional technology, in which via holes are formed and connected by plating between the first layer on which the semiconductor chip is mounted and the internal via holes, has advantages of not routing to the external edges, but on the other hand, it was difficult to form pad electrodes on the second surface, which required solder mask surrounding the pads.

Technologies using a laser for the formation of printed circuit boards are used mainly to perforate via holes. The laser used here is either an excimer laser, a YAO laser, or an impact laser which is an improved carbon dioxide laser. The application of an excimer laser to the manufacturing printed circuit boards are described in Japanese Open Patent 5-136650, 5-152744, and 5-152748, and the application of impact laser to the manufacturing of printed circuit boards is described in "A Large Format Modified TEA CO2 Laser Based Process for Cost Effective Via Generation" (1994 International Conference on Multichip Modules, Apr. 13–15, 1994). Reference is also made to U.S. Pat. No. 3,838,984 (FIGS. 5–8), where via holes are formed through a sheet (12) with gold bumps being found on the same side of the sheet for connecting both a chip and for connecting the sheet to a substrate.

SUMMARY OF THE INVENTION

This invention aims to solve the above problems associated with the structure and manufacturing methods of conventional ball grid array packages. Also, it aims to provide high density ball grid array packages which can mount high pin count semiconductor devices with simple methods and to provide such packages at low cost.

A ball grid array semiconductor package of this invention includes circuits in the form of metallizations or traces formed on a first surface of an insulative substrate or base material, each circuit having a grid pad electrode. A semiconductor chip is mounted on the substrate first surface juxtaposed to the circuits. Each grid pad electrode is opened, i.e. an aperture is formed, from a second surface of the substrate, each opening being connected to a solder ball grid which is melt-fixed to the back side of the grid pad electrode. Thus, the chip is connected to a first surface of the substrate while the solder balls are connected to the rear side of each grid pad electrode and extend outward from the opposite second surface of the substrate in an array suitable for connection to connection pads on a mother board.

A manufacturing method for a ball grid array package of this invention includes the steps of forming metallization circuits having grid pad electrodes arrayed in a grid on a conductive layer on the first surface of a substrate or base material; opening the substrate from an opposite second surface, the opening reaching to the backside of the grid pad electrodes; mounting a semiconductor chip on the substrate; electrically connecting the chip, by wire bond or the like, to the circuit; forming and attaching solder balls into each opening on the second surface of the substrate; melting the solder ball by reflowing the solder to electrically connect and fix the solder ball to the back side of the grid pad electrode on the first surface of the substrate; and encapsulating the first surface of the substrate including the chip, the bond wires, the circuitry metallization and the first surface of the substrate.

DETAILED DESCRIPTION OF THE INVENTION

Figure 1:
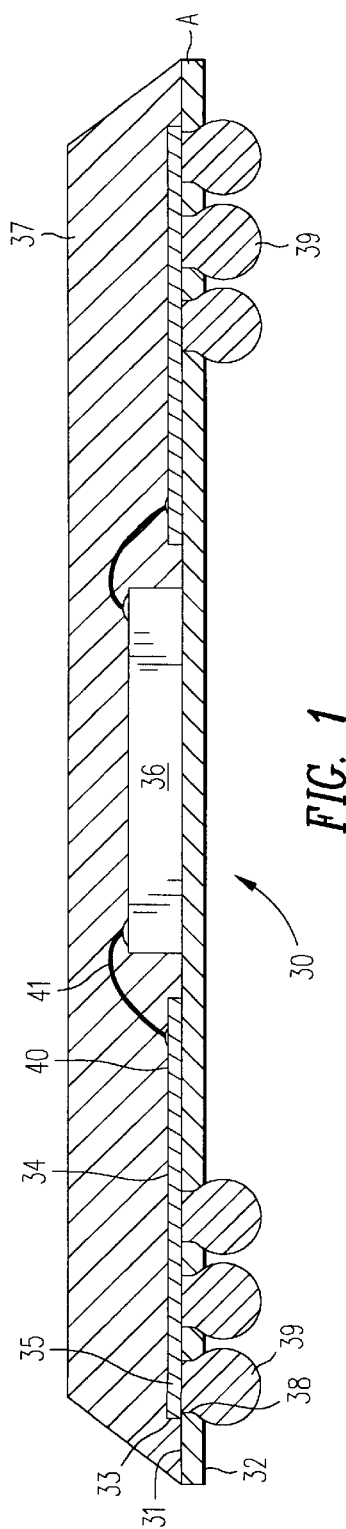
FIG. 1 is a schematic cross-sectioned view of the ball grid array of the semiconductor package of this invention.
Figure 9:
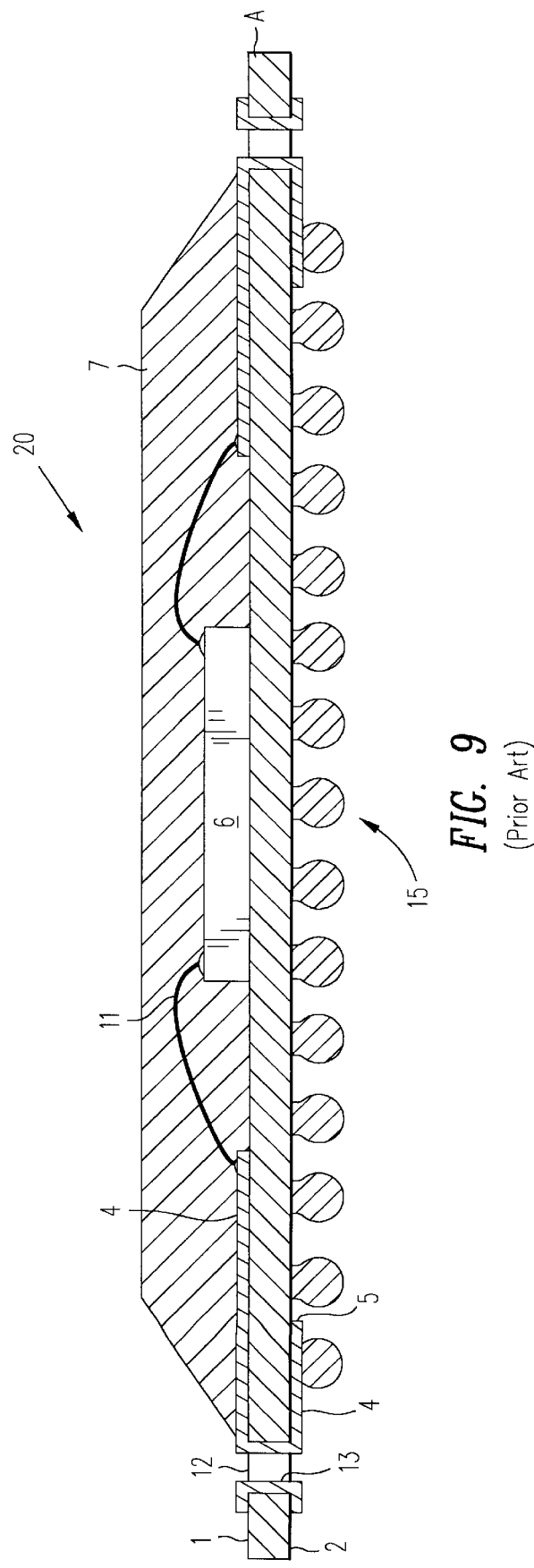
FIG. 9 is a schematic cross-sectional view of a prior art ball grid array.

As seen in FIG. 1, the ball grid array semiconductor package 30 of this invention includes circuits 34 in the form of circuitry metallizations or traces on a first surface 31 of an insulative substrate base material A, each circuit 34 having a grid pad electrode 35. A semiconductor chip 36 is mounted on the substrate juxtaposed to circuits 34 and is bonded to respective ones of pads 40 on the circuits by bond wires 41. The substrate is opened from a second surface 32 of the base material or substrate A, each opening 38 extending to the back side of each grid pad electrode 35. A solder ball 39 extends into each opening and is melt-fixed to the grid pad electrode back side. Therefore, the substrate here has no need to route conductive traces from each grid pad electrode to the edge of the substrate, has higher yield, and has no need of a solder mask for insulating routing traces and flow out of the solder. Also, the solder balls are attached to the grid pad electrode by melting and fixed through the opening. This results in high shear strength, with no delamination. Resultant connection with a mother board (not shown) is secured and become stronger. Moreover, the traces are formed only on the first surface of the substrate, and there is no need to form traces on the opposite second surface of the substrate. Thus, there is no need for solder resist which surrounds the grid pad electrodes, and the manufacturing process is simplified.

The substrate or base material is made of highly insulative resin. It may be a laminate including reinforcement, or a film or a sheet not including reinforcement. The insulative base material may be laminated with a conductive layer laminated to form a two-layer structure. The thickness of the substrate may be several microns to several hundred microns.

As the resin component of the insulative base material, epoxy resins, polyimide resins, bismaleimide-triazine resins, or polysilane resins are preferable. Both thermosetting and thermoplastic resins can be used. Among thermosetting resins, epoxy resins, polyimide resins, polycyanurate resins, polysilane resins and polybenzimidazole resins can be used.

The base material may be reinforced using glass fibers, ceramic fibers or organic fibers. Organic fibers such as aramid fibers, Teflon® fibers, poly-ether-ether-ketone fibers, polybenzimidazore fibers, etc. can be used. Aramid fibers and Teflon fibers are preferable because they are easily processed (excised) by lasers and have excellent electrical properties. Among aramid fibers, copolyparaphenylene 3, 4' oxydiphenylterephthalamide fiber is preferable because of higher purity and lower moisture regain.

In the case where base material is a film or a sheet not including a reinforcement, polyester, polyimide, poly-ether-ether ketone, polyamide, especially aramid, further especially polyparaphenylene thelephthalamide plastics are preferably used.

Figure 2:
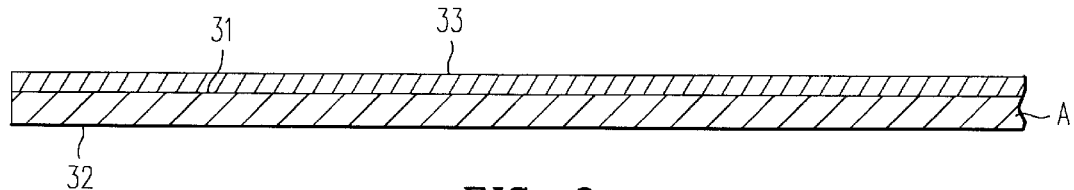
FIGS. 2–7 are schematic cross-sectional views of typical successive steps in the manufacture of the semiconductor package.
Figure 3:
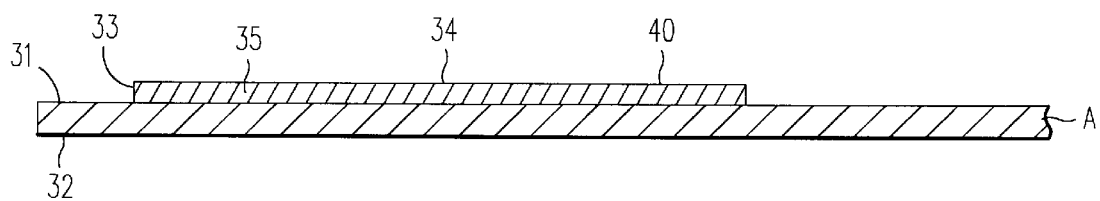

As seen in FIG. 2 in a first step of the method, on one side of the insulative base material A, i.e., on the first surface 31 on which a semiconductor chip 36 is to be mounted, a conductive layer 33 is formed composed of laminated copper foil and/or copper plating. The conductive layer as illustrated in FIG. 3 is etched to form grid pad electrodes 35 and bonding pads 40 the latter to be electrically connected to the semiconductor chip 36. A number of bonding pads 40 and a number of integrated grid pad electrodes 35 are located in an array, with a number of traces 34 integrally connecting both pads 40 and grid pad electrodes 35.

Figure 4:
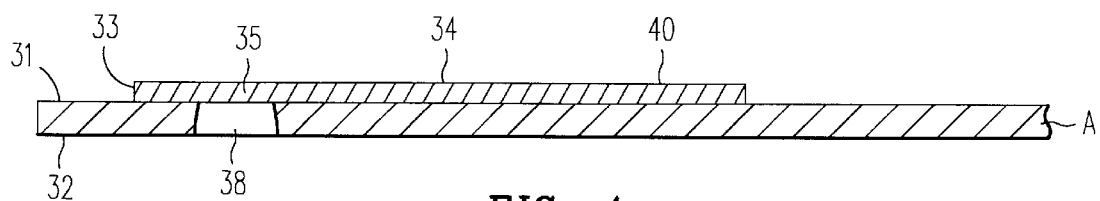

On the back side of each grid pad electrode 35, the insulative base material A is opened to form an opening 38 as seen in FIG. 4. Formation of the opening 38 can be made by opening from a second surface 32 of the base material A to the back side of the grid pad electrode 35 on the first surface 31. The formation of the opening 38 can be made by mechanical, chemical, or optical means. Especially, forming the opening by the action of a laser beam is simple and has high precision. Among lasers, a carbon dioxide laser, a YAG laser, or an excimer laser can be used. An impact laser, which is a variety of carbon dioxide laser, YAG laser, and excimer laser are preferably used to make the inner walls of the opening smooth, with no rough surface. The diameter of the opening 38 is smaller than the diameter of the grid pad electrode 35, and should be determined according to the diameter of solder balls to be attached, namely less than the maximum ball diameter. The opening 38 can be a hole having the same diameter on the first surface of the insulative base material A and the second surface, or the holes can be tapered expanding toward the second surface. The taper angle can be 1 to 30 degrees.

When a laser is used for forming the opening 38, masking methods such as a mask image method, a contact mask method, or conformal mask method can be used. The laser beam may be applied over a large area at one time and patterned by a mask or by moving a small-focused laser beam in line with a pre-determined pattern, or by scanning of a small-focused laser.

Figure 5:
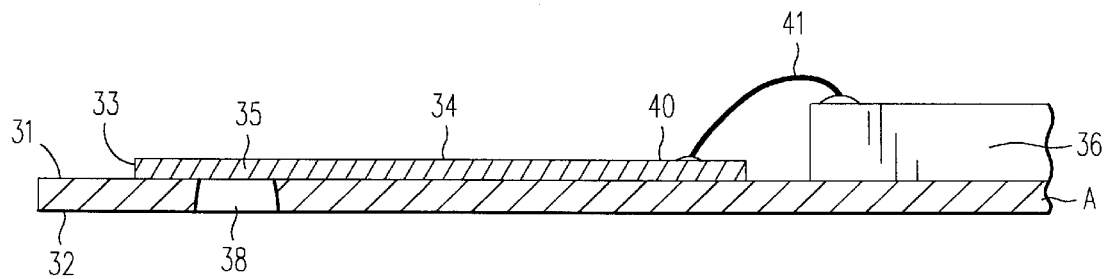
Figure 6:
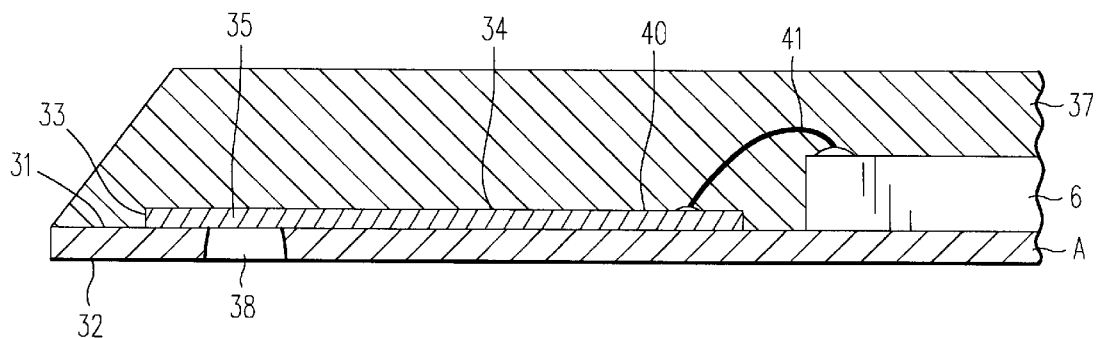

On both ends of the traces 34 on the first side 31 of the base material A, a nickel plating and a gold plating is applied to the pads 40 and the back side of grid pad electrodes 35. After that (FIG. 5), a semiconductor chip 36 is mounted on the center of the first surface, electrically connected with the substrate, and then (FIG. 6) encapsulated with a molding resin 37. To electrically connect the semiconductor chip 36 to the substrate, more particularly to pads 40, wire bonding, flip chip, or tape automated bonding processes can be applied.

Figure 7:
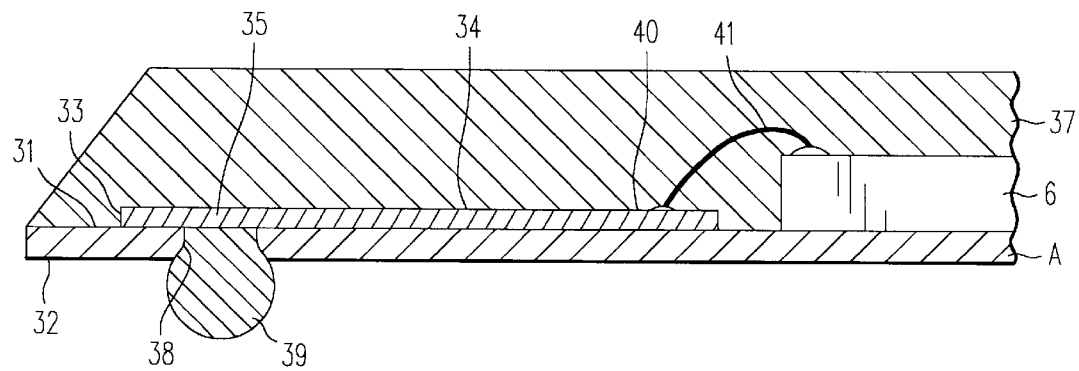

After that (FIG. 7), a solder ball 39 is formed in each opening 38 and each ball is attached to respectively electrically connect to the back side of the grid pad electrode 35 on the first surface 31. This can be done by placing pre-formed solder balls 39 in each opening 38, and reflow-soldering to melt the solder ball. The reflow soldering temperature typically will be in the range of 220–260° C. dependent on the eutectic of the solder. An eutectic solder such as 63% tin and 37% lead is typically used. Other solders may be utilized. Thus, the ball grid array package of this invention can be formed. The grid array package can then be connected to pads on a mother board by each solder ball 39. Solder paste can also be utilized with the paste applied on the back side of the grid pad electrodes or applied to pads on a mother board to which electrical connection is desired and then reflowing the solder paste so that it connects to and is fixed to the back side of the grid pad electrodes.

The ball grid array of this invention does not need solder mask on the traces connecting to the ball pads, since the opening of the base material A replaces the solder mask. Thus, yield is higher than in conventional structures, and lower cost is attained. Also, the solder balls 9 are melted securely into each opening 38. Thus the shear strength of each solder ball 39 is large enough to prevent delamination.

Connection with the mother board is ensured and become stronger. Moreover, the electrical layer 33 on the base material A is formed only on the first surface, and there is no need to form grid pad electrodes 35 on the second surface. Solder resist which surrounds the grid pad electrodes is not required, and thus the manufacturing process is simplified.

The ball grid array package can not only be formed by using the insulative base material A, and processed in panels, but also can be formed by using a flexible film or a sheet in strip form as in the '984 patent (FIGS. 1–2), and processed in a continuous operation. In the latter case, the mounting process can also be continuous, thus the total cost can be reduced.

EXAMPLES

FIG. 1 through 8 show the ball grid array package of this invention and its manufacturing processes.

A polyamic acid polyimide film (thickness of about 40 micron) was used as the insulative base material A. A copper foil 3 (thickness: about 18 micron) was laminated to the film to form a single-sided copper-clad laminate (width: 48 mm), and kept it in a long strip shape so that multiple units of packages can be processed.

Figure 8:
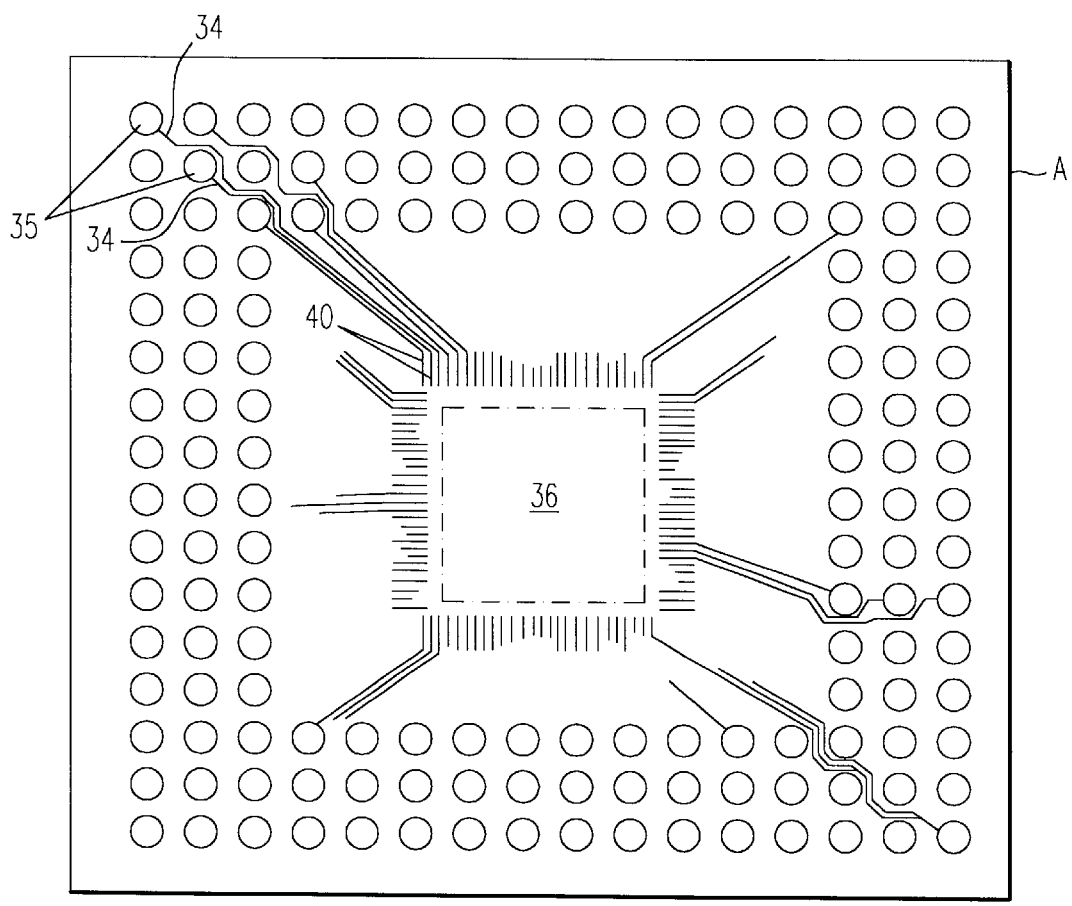
FIG. 8 is a plan view of FIG. 4 prior to the mounting of a semiconductor chip.

The copper foil on the first surface 31 of a resin film utilized as base material A is pattern-etched by a subtractive method. By this etching, a number of long circle (oval) bonding pads 40 (width: 100 micron) with a same pitch (150 micron), and grid-arrayed pad electrodes 35 (diameter: 0.7 mm) are formed on the periphery of each unit in the strip, and traces 34 (line width/space between lines is: 50 micron/50 micron) connecting between pads 40 and electrodes 35, one by one (FIG. 3 and 8).

Then, a laser beam (impact laser) is applied from the back side, i.e. the second surface, of the film to the center of the pad electrode 35 of the first surface 31 to form opening 38 by laser etching the base material A, the opening 38 reaching to the back side of the grid pad electrode 35 on the first surface 31 (FIG. 4). Here, the opening 38 is a tapered hole expanding to the direction of the second surface 32, and the first surface side is blinded or closed by the grid pad electrode 35. The hole diameter on the second surface 32 is 0.5 mm, and the declining angle is 6 degrees.

Then, nickel (5 micron) and gold (0.5 micron) platings are applied on the bonding pads 40, pad electrodes 35, and traces 34 between the pads and electrodes. Semiconductor chips 36 are mounted on the center of each unit on the film strip. Then, wire-bonding is performed between pads on the semiconductor chip 36 and the bonding pads 40 by gold wire 41. Encapsulation was accomplished by molding from the upper side of each semiconductor chip by a molding resin using a two-part mold, and unnecessary parts were removed by punching. After that, solder balls 39 were attached to each opening 38 opened on the second surface 32, and the solder balls were melted in a reflow soldering process so that the solder balls are fixed to and are connected to the back side of the grid pad electrodes 35 on the first surface 31 through the openings 38.

As mentioned above, the ball grid array package of the invention and its manufacturing method can provide high density ball grid array package which enables mounting of high pin count semiconductor chips with simple means, and can provide such packages with a very low cost.

I claim:

1. A ball grid array semiconductor package, consisting of:
   an insulative base material in the form of a flexible film or sheet;
   circuitry metallizations formed on a first surface of the insulative base material, each circuitry metallization having a grid pad electrode on said first surface of the base material, wherein the metallizations are in the form of a single-sided copper clad laminate on the insulative base material and said grid pad electrodes are patterned-etched grid pad electrodes;
   a semiconductor chip mounted on said first surface of the insulative base material juxtaposed to said circuitry metallizations and in substantially the same plane as said circuitry metallizations and electrically connected to said circuitry metallizations;
   a rigid, resin envelope molded over substantially all of said first surface of said insulative base material and encapsulating said semiconductor chip such that no flexible portion of said base material is left peripherally exposed thereby;
   wherein the insulative base material is open from an opposite second surface of the insulative base material to the first surface of the insulative base material to form an opening through said insulative base material and at a location under each grid pad electrode;
   a solder ball in each of said openings in a melt-fixed connection to a back side of each grid pad electrode; and
   wherein each opening without the need of a solder mask confines a portion of each solder ball which is in the melt-fixed connection to a back side of each grid pad electrode facing the second surface of the insulative base material.

2. A ball grid array package as defined in claim 1 wherein the insulative base material is a long film trip.

3. A ball grid array package as defined in claim 1 wherein the insulative base material is a polyimide film.

4. A ball grid array package as defined in claim 1 wherein the insulative base material includes a reinforcement of aramid fibers.

5. A ball grid array package as defined in claim 1 wherein said opening is a tapered opening expanding toward said second surface of the insulative base material.

6. A ball grid array package as defined in claim 5 where the angle of the tapered opening is from 1 to 30 degrees.

7. A ball grid array package as defined in claim 1 wherein the opening has a smaller diameter than a diameter of the grid pad electrode.

8. A ball grid array package as defined in claim 1 wherein the insulative base material is about 40 microns in thickness and said metallizations and grid pad electrodes are about 18 microns in thickness.

9. A ball grid array package as defined in claim 1, wherein the openings are formed with a laser.

10. A ball grid array package as defined in claim 1, wherein the openings are formed by punching.

11. A ball grid array package as defined in claim 1, wherein said back sides of said grid pad electrodes and portions of said metallizations are plated with nickel or gold.

* * * * *